United States Patent
Zhang (10) Patent No.: US 10,910,377 B2
(45) Date of Patent: Feb. 2, 2021

(54) LDMOS DEVICES, INTEGRATED CIRCUITS INCLUDING LDMSO DEVICES, AND METHODS FOR FABRICATING THE SAME

(71) Applicant: Globalfoundries Singapore Pte. Ltd., Singapore (SG)

(72) Inventor: Guowei Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/167,842

(22) Filed: Oct. 23, 2018

(65) Prior Publication Data
US 2020/0126990 A1  Apr. 23, 2020

(51) Int. Cl.
*H01L 29/78* (2006.01)
*H01L 29/66* (2006.01)
*H01L 29/40* (2006.01)
*H01L 29/10* (2006.01)
*H01L 27/092* (2006.01)
*H01L 29/08* (2006.01)
(Continued)

(52) U.S. Cl.
CPC .. *H01L 27/0927* (2013.01); *H01L 21/823878* (2013.01); *H01L 29/0865* (2013.01); *H01L 29/0882* (2013.01); *H01L 29/1095* (2013.01); *H01L 29/402* (2013.01); *H01L 29/66689* (2013.01); *H01L 29/7816* (2013.01); *H01L 29/517* (2013.01)

(58) Field of Classification Search
CPC .................................................. H01L 29/7816
See application file for complete search history.

(56) References Cited

U.S. PATENT DOCUMENTS

| 8,174,071 B2 | 5/2012 | Tien et al. |
| 8,878,275 B2 | 11/2014 | Kim et al. |
| 9,171,916 B1 * | 10/2015 | Snyder .................. H01L 29/402 |

(Continued)

FOREIGN PATENT DOCUMENTS

| TW | 201434158 A | 9/2014 |
| TW | 201539755 A | 10/2015 |

OTHER PUBLICATIONS

Taiwan Intellectual Property Office, Examination Report issued in Application No. 108134232 dated Aug. 21, 2020.

*Primary Examiner* — Omar F Mojaddedi
(74) *Attorney, Agent, or Firm* — Thompson Hine LLP; Anthony Canale (57) ABSTRACT

Laterally-diffused-metal-oxide-silicon (LDMOS) devices, integrated circuits including LDMOS devices, and methods for fabricating the same are provided. An exemplary LDMOS device includes a substrate having a surface, a gate structure overlying the surface and a channel region in the substrate below the gate structure, and a drain region in the substrate. The LDMOS device further includes a surface insulator region disposed between the gate structure and the drain region at the surface of the substrate and a dielectric block different from the surface insulator region and located over the surface insulator region. Also, the LDMOS device includes a field effect structure. The field effect structure includes a field plate disposed over and distanced from the surface of the substrate. The field effect structure also includes a conductive structure coupled to the field plate and extending from the field plate toward the dielectric block.

17 Claims, 3 Drawing Sheets

(51) Int. Cl.
  *H01L 21/8238*  (2006.01)
  *H01L 29/51*  (2006.01)

(56) References Cited

U.S. PATENT DOCUMENTS

| | | | |
|---|---|---|---|
| 10,529,812 B1* | 1/2020 | Edwards | H01L 29/66681 |
| 2004/0140517 A1* | 7/2004 | Tsuchiko | H01L 29/086 |
| | | | 257/493 |
| 2012/0228704 A1* | 9/2012 | Ju | H01L 29/402 |
| | | | 257/339 |
| 2013/0277741 A1* | 10/2013 | Guowei | H01L 29/7835 |
| | | | 257/343 |
| 2015/0287818 A1 | 10/2015 | Yen et al. | |

* cited by examiner

LDMOS DEVICES, INTEGRATED CIRCUITS INCLUDING LDMSO DEVICES, AND METHODS FOR FABRICATING THE SAME

TECHNICAL FIELD

The present disclosure generally relates to integrated circuits and methods for fabricating integrated circuits, and more particularly relates to integrated circuits having laterally diffused metal-oxide-semiconductor (LDMOS) devices.

BACKGROUND

LDMOS transistor devices are used in many applications, such as power management for cell phones, ADSL drivers, LED displays, LCD display drivers, high power amplifiers for wireless base stations, and others. LDMOS devices typically rely on a shallow conduction layer formed under an insulation region, such as a LOCOS ("local oxidation of silicon") region or a STI (shallow trench isolation) region, to handle the higher drain voltage imposed when the LDMOS device is biased.

The on-state resistance ("(RDSon") and the maximum breakdown voltage ("BV") of the device are two important operating parameters for an LDMOS device, and determine the applications with which the device may be utilized. On-state resistance is usually dependent upon the design/layout of the device, the process condition, temperature, diffusion length, and the various materials used to fabricate the devices. Breakdown voltage is defined as the largest reverse voltage that can be applied to a diode (e.g., a p-n junction) without causing an exponential increase in the current of the diode.

An LDMOS device that can operate at a high voltage close to the theoretical breakdown voltage of a semiconductor is preferred as an ideal power semiconductor device. Generally, LDMOS devices are suitable for use with high voltages because such devices include a drift region between the channel region and the drain region. Ideally, at the point of maximum breakdown voltage, the extended drain region of an LDMOS transistor is fully depleted of charge carriers. High electric fields in the LDMOS transistor are reduced when the extended drain region is fully depleted, and electric fields in an LDMOS transistor are more evenly dispersed over the length of the extended drain region when the extended drain region is fully depleted. Accordingly, the breakdown voltage of an LDMOS transistor is greatest when the extended drain region is fully depleted. The extended drain region may be depleted by lightly doping the elongated drift portion of the extended drain. However, a lightly-doped drift region increases the on-state resistance of the LDMOS device, which degrades RF performance.

Accordingly, it is desirable to provide an LDMOS device with a high breakdown voltage and a low on-state resistance. In addition it is desirable to integrate such devices with LDMOS devices having lower breakdown voltages in integrated circuit devices. Also, it is desirable to provide methods for fabricating LDMOS devices with high breakdown voltages and methods for fabricating integrated circuits with LDMOS devices with high breakdown voltages and LDMOS devices with lower breakdown voltages. Furthermore, other desirable features and characteristics will become apparent from the subsequent detailed description and the appended claims, taken in conjunction with the accompanying drawings and the foregoing technical field and background.

BRIEF SUMMARY

Laterally diffused metal-oxide-semiconductor (LDMOS) devices, integrated circuits including LDMOS devices, and methods for fabricating the same are provided. An exemplary LDMOS device includes a substrate having a surface, a gate structure overlying the surface and a channel region in the substrate below the gate structure, and a drain region in the substrate. The LDMOS device further includes a surface insulator region disposed between the gate structure and the drain region at the surface of the substrate and a dielectric block different from the surface insulator region and located over the surface insulator region. Also, the LDMOS device includes a field effect structure. The field effect structure includes a field plate disposed over and distanced from the surface of the substrate. The field effect structure also includes a conductive structure coupled to the field plate and extending from the field plate toward the dielectric block.

In another embodiment, an integrated circuit device includes a substrate having a surface, a first LDMOS device, a second LDMOS device, and a field effect structure configured to increase a breakdown voltage of the second LDMOS device. The first LDMOS device includes a first source region and a first drain region in the substrate, a first gate structure over the substrate and between the first source region and the first drain region, and a first surface insulator region disposed at the surface of the substrate between the first gate structure and the first drain region. The first surface insulator has a first thickness and a first width. The second LDMOS device includes a second source region and a second drain region in the substrate, a second gate structure over the substrate and between the second source region and the second drain region, a second surface insulator region disposed at the surface of the substrate between the second gate structure and the second drain region, and a dielectric block over the second surface insulator region. The second surface insulator has a second thickness equal to the first thickness and a second width greater than the first width. The field effect structure includes a field plate disposed over the second LDMOS device and distanced from the surface of the substrate. The field effect structure further includes a conductive structure coupled to the field plate and extending from the field plate toward the dielectric block.

In accordance with another embodiment, a method is provided for fabricating an integrated circuit device. The method includes forming isolation regions in a substrate having a surface to define a first device region and a second device region. The method further includes oxidizing the first device region to form a first surface insulator region in the first device region and a second isolation region in the second device region. The method includes depositing gate material over the substrate and patterning the gate material to form a first gate structure in the first device region and a second gate structure in the second device region. Also, the method includes forming a dielectric block over the second surface insulator region. Further, the method includes forming a field effect structure over the second LDMOS device, wherein the field effect structure includes a conductive structure disposed on the dielectric block.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Embodiments of LDMOS devices, integrated circuits including LDMOS devices and methods for fabricating such integrated circuits will hereinafter be described in conjunction with the following drawing figures, wherein like numerals denote like elements, and wherein.

DETAILED DESCRIPTION

The following detailed description is merely exemplary in nature and is not intended to limit the integrated circuits including LDMOS devices and fabrication methods as claimed herein. Furthermore, there is no intention to be bound by any expressed or implied theory presented in the preceding technical field, background or brief summary, or in the following detailed description.

In accordance with the various embodiments herein, integrated circuits including LDMOS devices and methods for fabricating LDMOS devices are provided. Generally, the following embodiments relate to the formation of at least one LDMOS device provided with a field effect structure to increase the breakdown voltage of the LDMOS device. Further, the LDMOS device may be provided with a thinner surface insulator region, as compared to conventional design, while exhibiting a higher breakdown voltage. This may be achieved by disposing a dielectric block over the surface insulator region. Other LDMOS devices formed during the same fabrication process may be formed without the dielectric block and retain a lower breakdown voltage and the corresponding lower drain resistance. Such processing may be desirable as such LDMOS devices are formed with a thinner surface insulator region that can be utilized at a smaller pitch.

FIGS. 1-4 illustrate sequentially a method for fabricating an integrated circuit having LDMOS devices in accordance with various embodiments herein. Various steps in the design and composition of integrated circuits are well known and so, in the interest of brevity, many conventional steps will only be mentioned briefly herein or will be omitted entirely without providing the well known process details. Further, it is noted that integrated circuits include a varying number of components and that single components shown in the illustrations may be representative of multiple components in the integrated circuits.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer.

Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

While "MOS" originally referred to metal-oxide-semiconductor transistors generally and metal-oxide-silicon transistors specifically, as used herein LDMOS transistors designate all types of insulated-gate field effect transistors, whether or not such transistors include metal gates, as the term "MOS" is commonly applied in the industry. For example, "MOS" transistors include those transistors utilizing silicon gate technologies that use doped polysilicon gates and silicided gates. In certain embodiments, a "conductor" or "conductor region" refers to a material having electrical conductivity greater than $1.0 \times 10^5$ S/cm. In certain embodiments, an "insulator", "insulator region", "dielectric", or a "dielectric material" refers to a material having electrical conductivity less than $1.0 \times 10^{-6}$ S/cm. All measurements for electrical conductivities are made at the standard condition.

Figure 1:
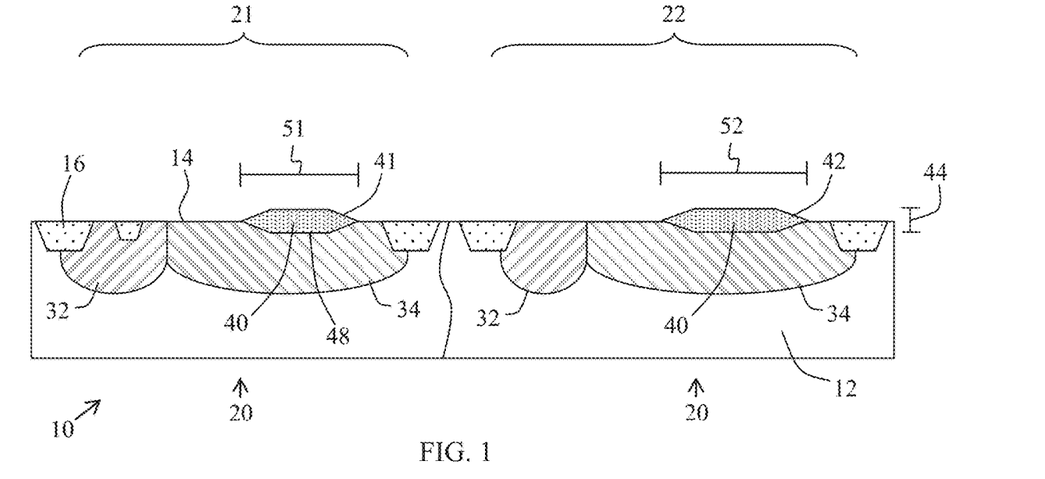
FIGS. 1-4 illustrate, in cross section, a portion of an integrated circuit and methods for fabricating the integrated circuit in accordance with various embodiments herein.

Turning now to FIG. 1, in an exemplary integrated circuit device 10 and process of fabricating an integrated circuit 10 is illustrated. The exemplary integrated circuit device 10 includes a substrate 12 with an upper surface 14. An exemplary substrate 12 is silicon, or other suitable semiconductor material. As used herein, the term "semiconductor substrate" may include any semiconductor materials typically used in the formation of electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, and the like. In an exemplary embodiment, the substrate 10 is doped with elements of a second conductivity type (e.g., p-type).

In FIG. 1, isolation regions 16, such as shallow trench isolation regions, are formed in the substrate 12 according to conventional processing techniques. For example, the substrate 12 may be etched to form voids, the voids may be filled with a thermal silicon oxide liner and silicon oxide fill, and excess isolation material may be removed by chemical mechanical planarization (CMP). Isolation regions 16 may isolate various device regions 20, i.e., regions where selected devices will be formed. For example, a first device region 21 and a second device region 22 may be defined by isolation regions 16. While shown adjacent to one another, it is noted that first device region 21 and second device region 22 need not be adjacent to one another on the substrate 12.

In FIG. 1, implantation processes may be performed to form a well region 32 and a drift region 34 in each device region 20. In certain embodiments, the well region 32 and drift region 34 are doped with opposite dopant types. For example, the well region 32 may be doped with an element of a second conductivity type (e.g., p-type) and the drift region 34 may be doped with an element of a first conductivity type (e.g., n-type). The well regions 32 and drift regions 34 may be formed according to conventional processing. For example, masks may be sequentially formed and patterned over the substrate 12, and desired implants performed.

As further shown in FIG. 1, surface insulator regions 40 are formed. Specifically, a surface insulator region 41 is formed in device region 21 and a surface insulator region 42 is formed in device region 22. Surface insulator regions 40 may be formed as field oxide, shallow trench isolation, or other suitable insulation material. In an exemplary embodiment, the surface insulator regions 40 are formed by a thermal growth process. For example, a local oxidation of silicon (LOCOS) process may be performed in which oxygen penetrates the surface 14 of the substrate 12 to form silicon oxide surface insulator regions 40, such that a horizontal interface 48 between each surface insulator region 40 and the substrate 12 is located at a plane lower than the surface 14 of the substrate 12. During a conventional process, silicon nitride may be deposited, masked and etched to selectively locate silicon nitride over non-desired regions, then the LOCOS oxidation process performed to form the surface insulation regions 40 before remaining silicon nitride is removed.

As a result of the simultaneous formation of the surface insulator regions 41 and 42 as a result of a same surface insulator region formation process, surface insulator region 41 and surface insulator region 42 are formed with a same maximum thickness or height 44. For example, the thickness 44 may be from about 500 to about 3000 Angstroms (A), such as about 1500 A. However, by varying dimensions during lithography processing, such as during patterning of masks, the surface insulator regions 41 and 42 can be formed with different widths, i.e., surface insulator region 41 is formed with a width 51 and the surface insulator region 42 is formed with a width 52. In exemplary embodiments, width 52 is greater than width 51. For example, width 51 may be from about 0.5 to about 1 micrometer (μm), such as about 0.8 μm, and width 52 may be from about 1 to about 5 μm, such as about 3 μm.

Figure 2:
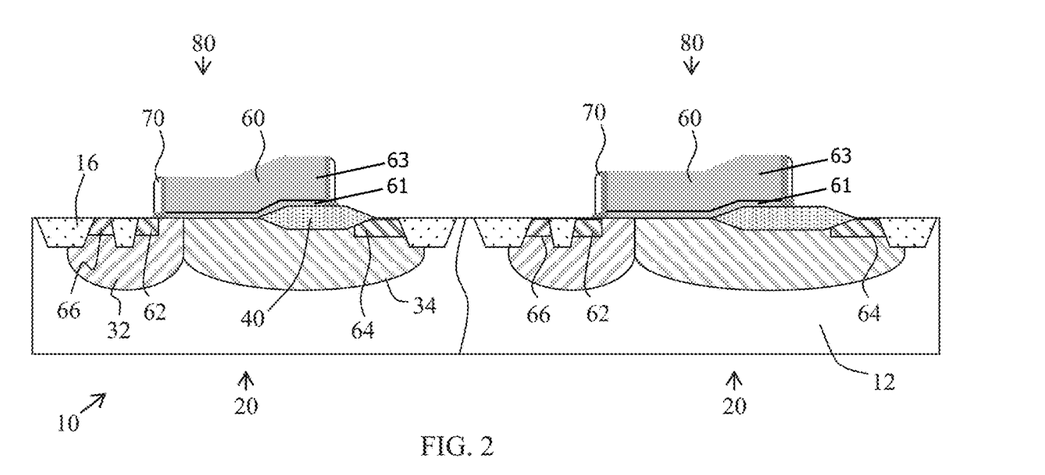

In FIG. 2, the method may continue with the formation of gate structures 60 in each device region 20. For example, a gate dielectric layer and gate material layer may be deposited over the substrate 12 and patterned according to conventional processing to form gate structures 60, wherein each gate structure 60 includes a gate dielectric 61 and a gate electrode 63. In an exemplary embodiment, the gate dielectric 61 may be silicon oxide and the gate electrode 63 may be polysilicon. The gate structures 60 may be patterned according to conventional gate formation processing.

Further implantation processes may then be performed. For example, a lightly doped drain region (not shown) may be formed in each drift region 34. In an exemplary embodiment, the lightly doped drain regions are doped with a first conductivity type (e.g., n-type). The process for implanting the drain regions may utilize the gate structures 60 as a mask. Then, spacers 70 are formed around each gate structure 60 according to conventional processing. Then, doping processes may be performed to form a source region 62 in the well region 32 and a drain region 64 in the drift regions 34. In an exemplary embodiment, the source regions 62 and drain regions 64 are heavily doped with a first conductivity type (e.g., n-type), i.e., the source regions 62 and drain regions 64 are n+ doped. Also, a well contact region 66 may be formed in the well region 32. In an exemplary embodiment, the well contact region 66 is heavily doped with a second conductivity type (e.g., p-type), i.e., the well contact region 66 is p+ doped. As a result of the processing described, an LDMOS device 80 is formed in each device region 20.

Figure 3:
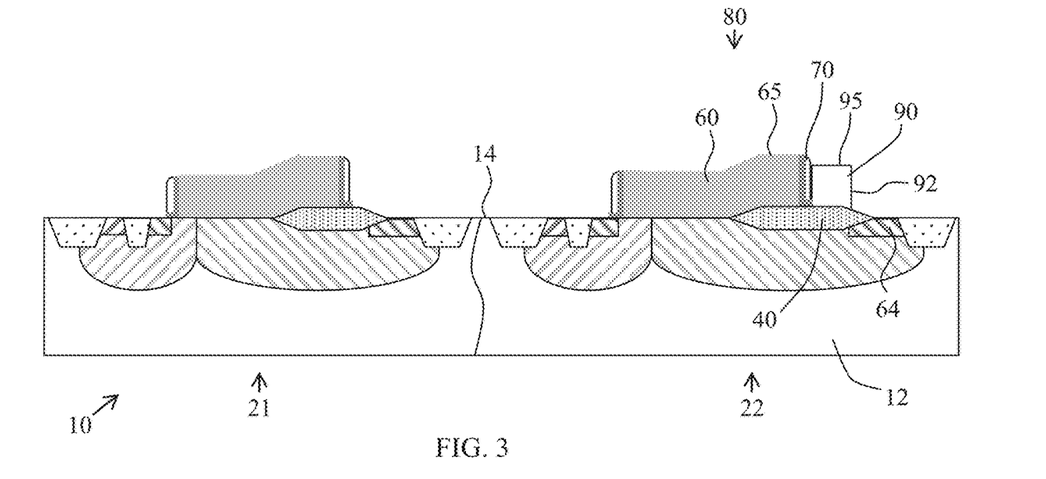

In FIG. 3, the method continues with the formation of a dielectric block 90 over the surface insulator region 40 of the LDMOS device 80 in device region 22. As shown, the dielectric block 90 may be in direct contact with the spacer 70 on the gate structure 60. In an exemplary embodiment, the dielectric block 90 does not contact the surface 14 of the substrate 12, i.e., does not contact the drain region 64. Rather, the exemplary dielectric block 90 is formed directly over only a central portion of the surface insulator region 40 and does not extend beyond the edges of the surface insulator region 40. In other words, the edge 92 of the dielectric block 90 contacts the surface insulator region 40. Further, in certain embodiments, an exemplary dielectric block 90 is shorter than the portion of the gate structure 60 over surface insulation region 40. In such embodiments, the gate structure 60 has a maximum height at, and terminates at, an upper surface 65, and the dielectric block 90 has a maximum height at, and terminates at, an upper surface 95. Thus, in such embodiments, upper surface 95 of dielectric block 90 is lower than, or closer to surface 14 of substrate 12 than, upper surface 65 of gate structure 60.

Dielectric block 90 may be formed as a salicide (self-aligned silicide) block, i.e., a material for blocking the silicidation of underlying surfaces. Specifically, during conventional processing to form devices on the substrate 12, a silicidation process is performed and includes the formation of salicide blocks. Therefore, the formation of dielectric block 90 in device region 22 does not add any additional processing to the integrated circuit fabrication process. In an exemplary embodiment, a layer of dielectric material is depositing and patterned to form the dielectric block 90. An exemplary dielectric block 90 may be formed of a layer or layers of silicon dioxide ($SiO_2$), tetraorthosilicate (TEOS), silicon nitride, or other suitable non-conductive or insulator material. In an exemplary embodiment, the dielectric block 80 is formed with a thickness or height of from about 1000 to about 4000 A, such as about 2000 A.

Figure 4:
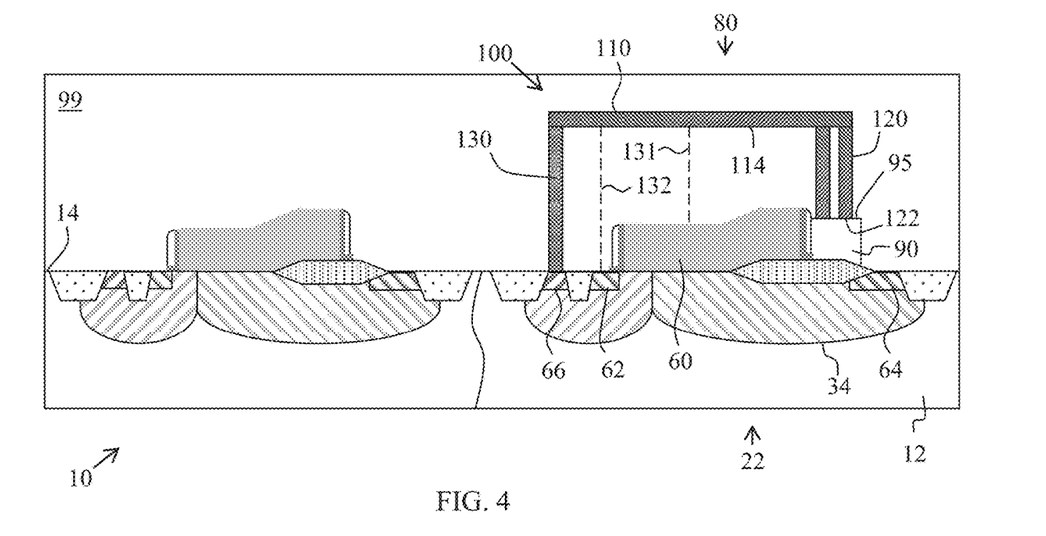

In FIG. 4, the method forms a layer or layers of dielectric material to form interlayer dielectric 99 over substrate 12. Further, as shown, a field effect structure 100 is formed over the LDMOS device 80 in device region 22. As shown, the field effect structure 100 includes a conductive field plate 110 and conductive structures 120 and 130, such as pillars, coupled to the conductive field plate 110. An exemplary field plate 110 and conductive pillars 120 and 130 are a conductive material, such as copper (e.g., metal 1 layer). The field plate 110 and conductive pillars 120 and 130 may be formed separately, or may be formed during a single deposition or fill process after trenches are formed in interlayer dielectric 99, as is well understood.

As shown, the field plate 110 is disposed over and distanced from the surface 14 of the substrate 12, and, more specifically, is disposed directly over the gate structure 60 in device region 22. An exemplary field plate 110 has a planar, horizontal lower surface 114 that is substantially parallel to the surface 14 of substrate 12. An exemplary field plate 110 extends beyond the gate structure 60 and lies directly over the region between the gate structure 60 and the drain region 64, or even directly over the drain region 64, to assist in shaping an electrical field in the drift region 34 of the device 80 in device region 22.

As shown, the conductive pillars 120 and 130 directly contact and are electrically coupled to the lower surface 114 of the field plate 110. Conductive pillar or pillars 120 extend downward from the field plate 110 toward the dielectric block 90. In exemplary embodiments, the conductive pillars 120 terminate at a distal end 122 that lands on, i.e., is in direct contact with, the upper surface 95 of dielectric block 90. In FIG. 4, conductive pillar 130 extends downward from the field plate 110 toward the substrate 12 and directly contacts the well contact region 66. Alternatively, the conductive pillar 130 may be located as indicated by dashed line 131 and directly contact the gate electrode of the gate structure 60, or be located as indicated by dashed line 132 and directly contact the source region 62. In each case, the conductive pillar 130 is electrically coupled to the well contact region 66, gate structure 60 or source region 62.

As a result, the field effect structure 100 is electrically connected to the gate structure 60, source region 62, or well contact region 66 to maximize the potential difference between the field effect structure 100, and in particular the distal end 122 of the conductive pillar 120, and the drain region 64 of the device 80 to maximize the ability of field effect structure 100 to shape the electrical field generated between the source region 62 and the drain region 64 when voltages are applied to the drain and gate.

Figure 5:
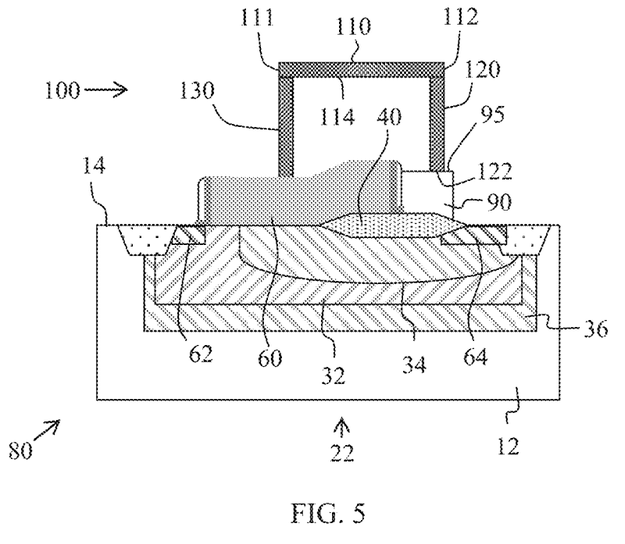
FIGS. 5 and 6 illustrate, in cross section, alternate embodiments of the LDMOS device and field effect structure of FIG. 4.

FIG. 5 illustrates an alternate embodiment of the LDMOS device 80 and field effect structure 100 of FIG. 4. It is noted that in FIG. 5, the well region 32 extends below and around drift region 34 as is conventional in certain applications. For example, well region 32 may be a high voltage well region, and drift region 34 may be a high voltage drift region. Also, an additional high voltage well region 36 may be provided deeper and around well region 32. Typically, well region 36 may be doped with a first conductivity type (e.g., n-type), opposite that of well region 32.

As shown in FIG. 5, the field plate 110 extends from an end 111 directly over gate structure 60 to an end 112 directly over dielectric block 90. Conductive pillar 130 contacts the lower surface 114 of the field plate 110 flush with end 111, and extends substantially vertically downward into contact with the gate structure 60. A single conductive pillar 120 contacts the lower surface 114 of the field plate 110 flush with end 112 and extends substantially vertically downward into contact with the dielectric block 90.

Figure 6:
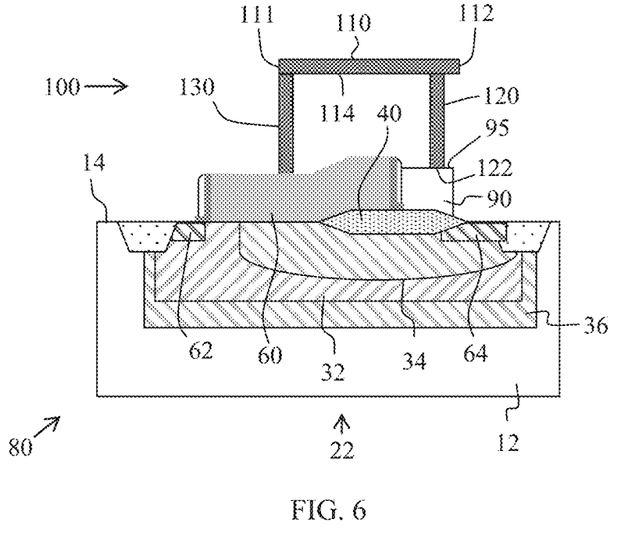

FIG. 6 illustrates an alternate embodiment of the LDMOS device 80 and field effect structure 100 of FIG. 5. In FIG. 6, the field effect plate 110 is longer than in the embodiment of FIG. 5. As shown, the field effect plate extends to end 112, which may lie directly over the surface isolator region 40 and not directly over the dielectric block 90. A single conductive pillar 120 contacts the lower surface 114 of the field plate 110 at a location spaced from end 112, such that a portion of the lower surface 114 is located between the conductive pillar 120 and the end 112. As shown, the conductive pillar 120 extends substantially vertically downward into contact with the dielectric block 90.

The embodiments of FIGS. 4-6 illustrate that different arrangements may be provided to obtain the desired effect on the electric field in the drift region 34 from the field effect structure 100. Certain other embodiments may combine a feature or various features from each embodiment.

In conventional LDMOS devices, breakdown hot spots often occur near the drain side edge of the gate structure, where the electrical field is high. As described herein, the conductive field effect structure 100 may be utilized to position a lower electrical potential nearer to the drain region 64 of the LDMOS device 80. Specifically, during operation of the LDMOS transistor device 80, the field effect structure 100 is subjected to an electric potential from the contact between the conductive pillar 130 and the LDMOS transistor 80. By subjecting the field effect structure 100 to a particular electric potential, the electric field that forms between gate structure 60 and drain region 64 can be modulated. This modulation may operate to increase the breakdown voltage between the gate structure 60 and drain region 64. For example, the field effect structure 100 may effectively force the high electrical fields that are normally present near the drain side edge of the gate structure 60 farther away from the gate structure 60 and toward the drain region 64. In this manner, the breakdown voltage of the LDMOS device 80 may be increased.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A laterally diffused metal-oxide-semiconductor (LDMOS) device comprising:
    a substrate having a surface;
    a gate structure overlying the surface of the substrate, the gate structure including a gate electrode and a gate dielectric;
    a channel region in the substrate underlying the gate structure;
    a drain region in the substrate;
    a local oxidation of silicon (LOCOS) region disposed laterally between the gate structure and the drain region at the surface of the substrate;
    a dielectric block different from the LOCOS region, the dielectric block located over the LOCOS region;
    a field effect structure including a field plate, the field plate disposed over and distanced from the surface of the substrate; and
    a conductive structure, the conductive structure coupled to the field plate, and the conductive structure extending from the field plate toward the dielectric block,
    wherein the dielectric block is located only on a portion of the LOCOS region, a portion of the gate electrode and a portion of the gate dielectric are positioned on the LOCOS region, and the LOCOS region is positioned between the portion of the gate dielectric and the surface of the substrate.

2. The LDMOS device of claim 1 wherein the conductive structure is located directly over the dielectric block.

3. The LDMOS device of claim 1 wherein the conductive structure physically contacts the dielectric block.

4. The LDMOS device of claim 1 further comprising:
    a source region in the substrate; and
    a drift region in the substrate,
    wherein the drain region is located in the drift region.

5. The LDMOS device of claim 1 further comprising:
a source region in the substrate; and
a drift region in the substrate,
wherein the drain region is located in the drift region, and the conductive structure is located between the gate structure and the drain region.

6. The LDMOS device of claim 1 further comprising:
a source region in the substrate,
wherein the field plate is electrically coupled to the source region.

7. The LDMOS device of claim 1 further comprising:
a body region in the substrate,
wherein the field plate is electrically coupled to the body region.

8. The LDMOS device of claim 1 wherein the field plate is electrically coupled to the gate structure.

9. The LDMOS device of claim 1 wherein the dielectric block has an edge that contacts the LOCOS region.

10. The LDMOS device of claim 1 further comprising:
a drift region in the substrate,
wherein the drain region is located in the drift region, and the LOCOS region is located between the portion of the gate electrode and the drift region.

11. The LDMOS device of claim 1 wherein the LOCOS region has a thickness in a range of about 500 Angstroms to 3000 Angstroms.

12. The LDMOS device of claim 1 wherein the LOCOS region has a first width, and the dielectric block has a second width that is less than the first width.

13. The LDMOS device of claim 1 wherein the dielectric block does not contact the surface of the substrate.

14. The LDMOS device of claim 1 further comprising:
a spacer on the gate structure,
wherein the dielectric block is in direct contact with the spacer.

15. The LDMOS device of claim 1 wherein the dielectric block has an upper surface at a first height above the LOCOS region, and the conductive structure is in direct contact with the upper surface of the dielectric block.

16. The LDMOS device of claim 15 wherein the gate structure has an upper surface at a second height above the LOCOS region, and the upper surface of the dielectric block is closer to the surface of the substrate than the upper surface of the gate structure.

17. The LDMOS device of claim 1 wherein the LOCOS region has a thickness of about 1500 Angstroms.

\* \* \* \* \*

UNITED STATES PATENT AND TRADEMARK OFFICE
CERTIFICATE OF CORRECTION

PATENT NO. : 10,910,377 B2  Page 1 of 1
APPLICATION NO. : 16/167842
DATED : February 2, 2021
INVENTOR(S) : Guowei Zhang It is certified that error appears in the above-identified patent and that said Letters Patent is hereby corrected as shown below:

On the Title Page

Item (54) and in the Specification, Column 1, Line 2, change "LDMSO" to --LDMOS--

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*